(12) United States Patent
Senatori

(10) Patent No.: US 8,937,806 B2
(45) Date of Patent: Jan. 20, 2015

(54) FLOW DIVERSION APPARATUSES AND METHODS

(75) Inventor: Mark David Senatori, The Woodlands, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 246 days.

(21) Appl. No.: 13/697,512

(22) PCT Filed: May 20, 2010

(86) PCT No.: PCT/US2010/035632
§ 371 (c)(1),
(2), (4) Date: Nov. 12, 2012

(87) PCT Pub. No.: WO2011/146064
PCT Pub. Date: Nov. 24, 2011

(65) Prior Publication Data
US 2013/0077241 A1    Mar. 28, 2013

(51) Int. Cl.
*H05K 7/20* (2006.01)
*G06F 1/20* (2006.01)

(52) U.S. Cl.
CPC ............ *H05K 7/20127* (2013.01); *G06F 1/203* (2013.01)
USPC ..................... 361/679.47; 165/80.3; 165/80.4; 165/104.33; 454/184; 361/679.51; 361/694; 361/700; 361/701; 312/236

(58) Field of Classification Search
CPC ................................. G06F 2200/201–2200/203
USPC ............... 361/679.46–679.54, 688–723, 831, 361/679.52, 679.53, 679.47, 361/679.55–679.56, 679.21–679.3, 361/679.01–679.61, 679.08–679.2, 361/679.26–679.27; 165/80.1–80.5, 165/104.33, 185; 174/15.1–15.2, 174/16.1–16.3; 454/184; 312/236; 248/919–923, 176.1, 225.21; 345/905; 349/58
See application file for complete search history.

(56) References Cited

U.S. PATENT DOCUMENTS

| | | | |
|---|---|---|---|
| 4,980,848 A * | 12/1990 | Griffin et al. | ............ 361/679.26 |
| 5,946,187 A * | 8/1999 | Cipolla | ..................... 361/679.27 |
| 6,069,791 A * | 5/2000 | Goto et al. | ............... 361/679.54 |
| 6,078,495 A | 6/2000 | Cipolla et al. | |

(Continued)

FOREIGN PATENT DOCUMENTS

| | | |
|---|---|---|
| JP | 08-094141 A | 4/1996 |
| JP | 08-197941 A | 8/1996 |
| JP | 2007-107792 A | 4/2007 |

OTHER PUBLICATIONS

International Search Report and Written Opinion received in PCT Application No. PCT/US2010/035632, mailed Jan. 25, 2011, 8 pages.

*Primary Examiner* — Zachary M Pape
*Assistant Examiner* — Razmeen Gafur

(57) ABSTRACT

Flow diversion apparatuses and methods are provided. A flow diversion apparatus can include a vent configured to permit the flow of a fluid therethrough. The apparatus can also include an electronic device capable of a range of motion across at least a portion of the vent disposed proximate at least a portion of the vent. The apparatus can include a shutter disposed proximate at least a portion of the vent opposite the electronic device. The shutter can be capable of a range of motion across at least a portion of the vent in conjunction with the electronic device. The shutter can prevent at least a portion of the fluid flowing through the vent from impinging on the electronic device.

16 Claims, 5 Drawing Sheets

(56) References Cited

U.S. PATENT DOCUMENTS

| | | | |
|---|---|---|---|
| 6,115,252 A * | 9/2000 | Ohta et al. | 361/700 |
| 6,449,149 B1 * | 9/2002 | Ohashi et al. | 361/679.46 |
| 6,816,371 B2 * | 11/2004 | Agata et al. | 361/679.27 |
| 7,155,914 B2 * | 1/2007 | Ishinabe et al. | 62/3.2 |
| 7,187,538 B2 * | 3/2007 | Homer et al. | 361/679.21 |
| 7,312,988 B2 | 12/2007 | Maeda | |
| 7,457,113 B2 * | 11/2008 | Kumhyr et al. | 361/679.48 |
| 7,733,644 B2 * | 6/2010 | Wilson et al. | 361/679.49 |
| 7,773,903 B2 * | 8/2010 | Kao | 399/81 |
| 8,270,156 B2 * | 9/2012 | Iijima | 361/679.51 |
| 8,520,382 B2 * | 8/2013 | Tye et al. | 361/694 |
| 8,619,415 B1 * | 12/2013 | Lam et al. | 361/679.26 |
| 2005/0212792 A1 * | 9/2005 | Tachikawa et al. | 345/211 |
| 2006/0114653 A1 * | 6/2006 | Seto et al. | 361/695 |
| 2008/0242215 A1 | 10/2008 | Pagenstert | |
| 2010/0002064 A1 * | 1/2010 | Silverbrook | 347/108 |
| 2011/0292605 A1 * | 12/2011 | Chen et al. | 361/695 |
| 2012/0127652 A1 * | 5/2012 | Lin et al. | 361/679.46 |
| 2014/0009888 A1 * | 1/2014 | MacDonald et al. | 361/701 |

* cited by examiner

FLOW DIVERSION APPARATUSES AND METHODS

BACKGROUND OF THE INVENTION

Description of the Related Art

Thermal management within portable electronic devices frequently consists of two steps: first, drawing the heat away from a heat producing component most frequently using a fleet transfer fluid; and second, expelling the warm fluid from the portable electronic device without adversely affecting the operation of one or more internal or external components. Heat can be withdrawn from the heat producing devices either by direct convection to a cool fluid or by conduction to a thermal member such as a heat pipe or heat exchanger and thence to the cool fluid. The warm fluid exiting the heat producing device or heat exchanger must be expelled or rejected from the portable electronic device without adversely affecting the operation of other components or the functionality of the electronic device itself.

BRIEF DESCRIPTION OF THE DRAWINGS

Advantages of one or more disclosed embodiments may become apparent upon reading the following detailed description and upon reference to the drawings in which.

DETAILED DESCRIPTION

Figure 1A:
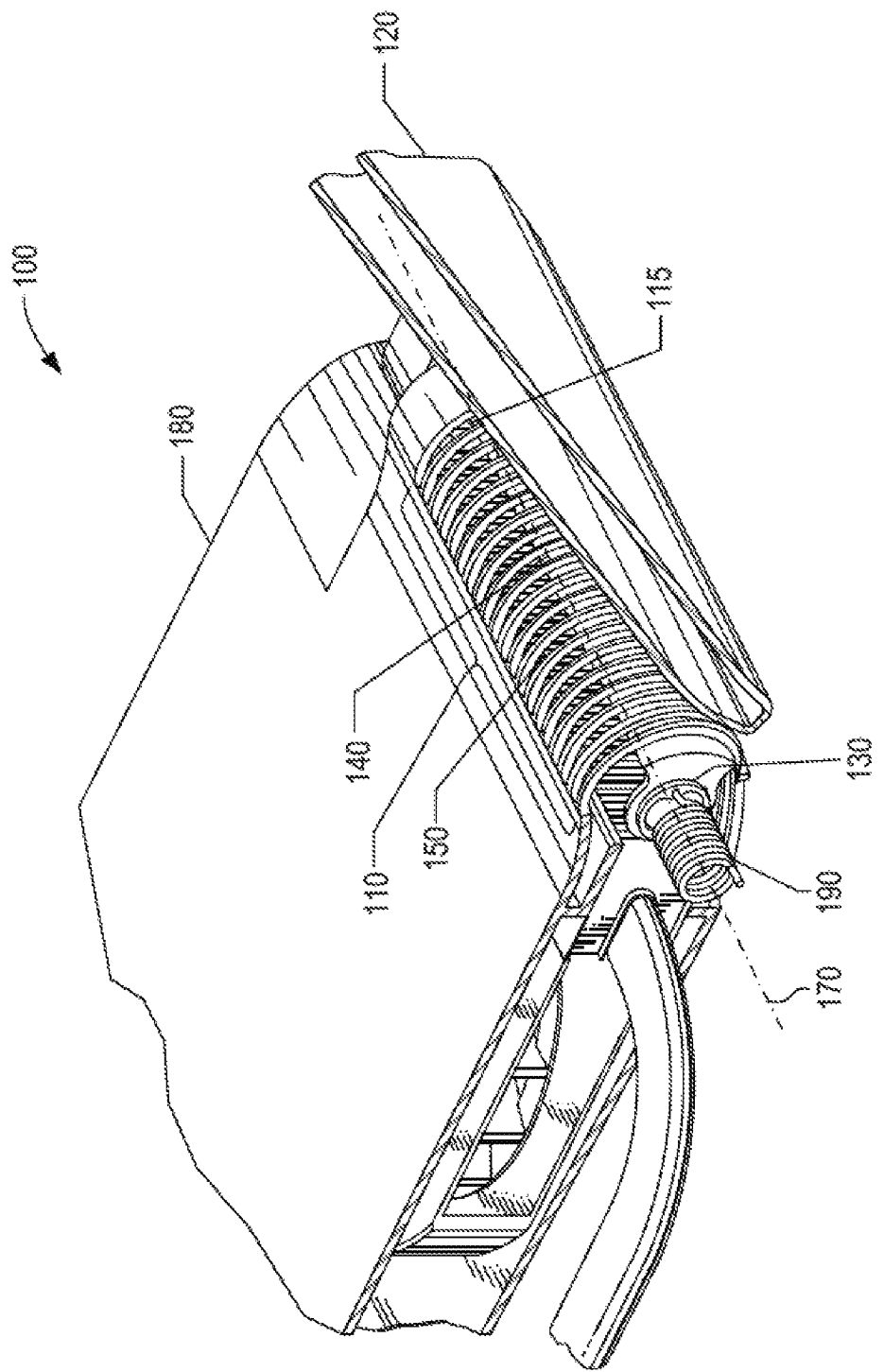
FIG. 1A is a perspective view depicting an illustrative flow diversion system, according to one or more embodiments described herein.

Heat is generated by heat producing electronic devices, such as central processing units ("CPUs") and graphical processing units ("GPUs") used in most portable electronic devices such as slate computers, laptop computers, netbooks, handheld gaming devices, and handheld cellular devices. The heat generated by such devices must be removed or otherwise dissipated to minimize the performance impact to the portable electronic device. Given the ever decreasing size of portable electronic device housings, heat removal becomes a significant undertaking. Heat is often removed from the portable electronic device by introducing a cool fluid such as air into the housing. Within the housing, the cool fluid is heated by passage through or around heat producing devices and heat exchange devices, heating the fluid, and providing a warm fluid. Evacuating this warm fluid from the housing becomes problematic since passage of the warm fluid across components or devices disposed within the housing can adversely affect the performance or life of the component or device. Various flow diversion apparatuses and methods can be used to minimize the adverse effects of the warm fluid on components or devices disposed within the housing.

A flow diversion apparatus is provided. The apparatus can include a vent configured to permit the flow of a fluid therethrough. The apparatus can also include an electronic device capable of a range of motion across at least a portion of the vent disposed proximate at least a portion of the vent. The apparatus can further include a shutter disposed proximate at least a portion of the vent opposite the electronic device. The shutter can be capable of a range of motion across at least a portion of the vent in conjunction with the electronic device. The shutter can prevent at least a portion of the fluid flowing through the vent from impinging upon the electronic device.

A flow diversion method is also provided. The method can include flowing a fluid through least a portion of a vent having an electronic device disposed proximate thereto. The electronic device car be displaceable through a range of motion. The method can further include diverting at least a portion of the fluid flow using a shutter disposable through the range of motion proximate the vent and opposite the electronic device. The shutter can prevent at least a portion of the fluid flowing through the vent from impinging upon the electronic device.

A flow diversion system is also provided. The system can include a housing having a semicircular vent having a cross-sectional area adapted to permit the flow of a fluid therethrough. The system can further include an electronic device disposed proximate the vent, the electronic device hingedly connected to the housing; the hinge and the vent sharing a common central axis. The electronic device can be capable of a range of motion about the common central axis, across at least a portion of the vent. The system can also include a shutter that prevents at least a portion of the fluid flowing through the vent from impinging upon the electronic device. The shutter can be capable of a range of motion about the common central axis having a semicircular section disposed proximate the vent, opposite the electronic device. The shutter can obstruct at least a portion of the vent, thereby apportioning the vent into a closed cross-sectional area ("CSA") portion and an open CSA portion that is not reduced through the full range of motion of the shutter.

Figure 1B:
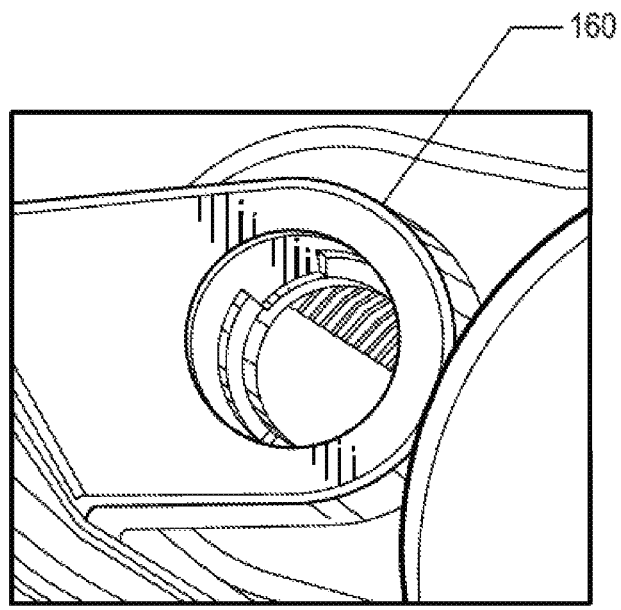
FIG. 1B is a detail view depicting en illustrative flow diversion catch, according to one or more embodiments described herein.

For clarity and ease of description, FIGS. 1A and 1B will be discussed in detail as a group. FIG. 1A to is a perspective view depicting an illustrative flow diversion system 100, according to one or more embodiments. FIG. 1B is a detail view depicting an illustrative flow diversion catch 160, according to one or more embodiments. The system 100 can include as vent 110 disposed on an enclosure 180, an electronic device 120 disposed proximate the vent 110, and a shutter 130 opposite at least a portion of the electronic device 120 disposed proximate the vent 110 opposite at least a portion of the electronic device 120.

The vent 110 can have a cross sectional area 115 configured to permit the passage or flow of a fluid therethrough. The shutter 130 can be disposed Proximate the vent 110, apportioning the vent into a closed cross-sectional area portion ("closed CSA") 140 and an open cross-sectional area portion ("open CSA") 150.

The electronic device 120 and the shutter 130 can be jointly or rotatable about an axis. In some embodiments, the electronic device 120 and the shutter 130 can be disposed such that they rotate about a common central axis 170. A tension member 190 can be used to bias the shutter 130 to a predetermined position. A catch 160 can be used to operably connect or mechanically link the electronic device 120 with the shutter 130.

An "operable connection", or a connection by which entities are "operably connected", is one in which the entities are connected in a manner whereby the one entity is in some way connected to a second entity. An operable connection can be directly between the first and the second entities, for example through the use of threaded fasteners, nails, chemical adhesives, weldment, or the like. A direct connection between the first and the second entities can be non-detachable, for example through the use of chemical adhesives or weldment or detachable, for example through the use of removable fasteners such as threaded fasteners or cam-lock connectors. An operable connection can be indirectly between the first and the second entities via one or more intermediate entities, for example a piston can be operatively connected to a crankshaft via a connecting rod, an intermediate entity.

One or more heat producing devices, for example one or more battery or the powered computing devices, can be at least partially disposed within the enclosure 180. During operation, the heat generated by the device can accumulate within the enclosure unless provisions are made to evacuate the heat from the enclosure. Such provisions often include the disposal of a vent 110 on the enclosure 180 to permit heat to escape. The vent 110 can be any shape, size, geometry or configuration adapted to permit the flow of a fluid, for example a thermal or heat transfer fluid, therethrough. Such fluids can include, without limitation, any gas, liquid, or multiphase fluid adapted to transport or convey at least a portion of the heat from the enclosure 180 to the surrounding environment. Air is an example of a gas, while a non-electrically conductive liquid is an example of a liquid.

As depicted in FIG. 1A, the electronic device 120 and the housing 180 can be operably connected by one or more hinges disposed along an axis of rotation ("axis"). Referring again to FIG. 1A, where the electronic device 120 and the housing 180 are connected using one or more hinges, at least a portion of the vent 110 can be disposed proximate the hinge. In some embodiments, the vent 110 can include a plurality of parallel slots, coaxially aligned with the axis of rotation of the electronic device 120.

Warm fluid conveying the heat from the enclosure 180 can flow through at least a portion of the vent 110. In the absence of the shutter 130, at least a Portion of the warm fluid escaping through the vent 110 would impact or impinge upon the electronic device 120. Under certain conditions, the flow of warm fluid across, around, or about the electronic device 120 may adversely affect or impact the operation of the electronic device 120. For example, where the enclosure 180 houses a portable computing device and the electronic device 120 is a liquid crystal display ("LCD")communicatively coupled to the portable computing device, the flow of warm fluid across the LCD can affect the color accuracy or color reproducibility of the LCD. The electronic device 120 can include any electrical device that could similarly suffer a performance degradation or failure due, at least in part, the heating attributable to the flow of warm fluid from the enclosure 180 via the vent 110.

At least a portion of the flow of warm fluid through the vent 110 can be diverted, interrupted, or otherwise redirected by the shutter 130. The shutter 130 can be a single or multi-piece member disposed proximate at least a portion of the vent 110. Since the electronic device 120 can be rotated or otherwise displaced about the axis of rotation of the hinge, at least a portion of the shutter 130 can be similarly rotatable or displaceable about a common axis of rotation ("common axis") 170. The operable connection between the electronic device 120 and the shutter 130 can be mechanical or electro-mechanical. In some embodiments a rotating catch 160 disposed along the common axis 170 as depicted in FIG. 1B can be used to displace the shutter 130 in conjunction with the electronic device 120.

In some embodiments, the electronic device 120 and the shutter 130 can be operably connected such that a displacement of the electronic device 120 can result in a proportionate displacement of the shutter 130. For example a rotation of the electronic device 120 through an arc of $\alpha°$ can result in a comparable rotation of the shutter 130 through an arc of $\alpha°$, both arcs measured about the common axis 170. By operably connecting the electronic device 120 and the shutter 130, warm fluid exiting the enclosure 180 via the vent 110 and impacting or otherwise flowing around, across, or about the electronic device 120 can be reduced. By reducing the quantity of warm fluid flowing around, across, or about the electronic device 120, the temperature rise experienced by the electronic device 120 attributable to the flow of the warm fluid can be reduced.

As the shutter 130 is displaced across the vent 110, the shutter 130 will obstruct a portion of the vent 110, thereby preventing the flow of fluid therethrough. The shutter 130 can thereby apportion the vent into the closed CSA portion 140 and the open CSA portion 150. In some embodiments, the sum of the closed CSA portion 140 and the open CSA portion 150 can provide the total CSA 115 of the vent 110. In some embodiments, the CSA 115 can be apportioned into a closed CSA portion 140 having a fixed area and an open CSA portion 150 having a fixed area; thus, the open CSA portion 150 is not reduced throughout the full range of motion of the electronic device 120 and the shutter 130. By not reducing the open CSA portion 150, an exit path for the warm fluid flowing from the enclosure 180 exists at all times, regardless of the position of the electronic device 120 and shutter 130, thereby providing relatively consistent cooling of the heat producing electronic device disposed within the enclosure 180.

A tension member 190 can be used to bias the shutter 130 to a predetermined position. Biasing the shutter 130 to a predetermined position can afford a failsafe operation should the operable connection between the electronic device 120 and the shutter 130 be lost or otherwise fail. In some embodiments, the tension member 190 can position the shutter 130 in a default position diverting the warm fluid flowing from the vent 110 from impacting the electronic device 120 when the device is disposed in a "typical" or "common" operating position. For example if the electronic device contains an LCD display, the default position for the shutter 130 can be at an angle of about 40° to about 60°, the "typical" viewing angle of an LCD display.

Figure 2A:
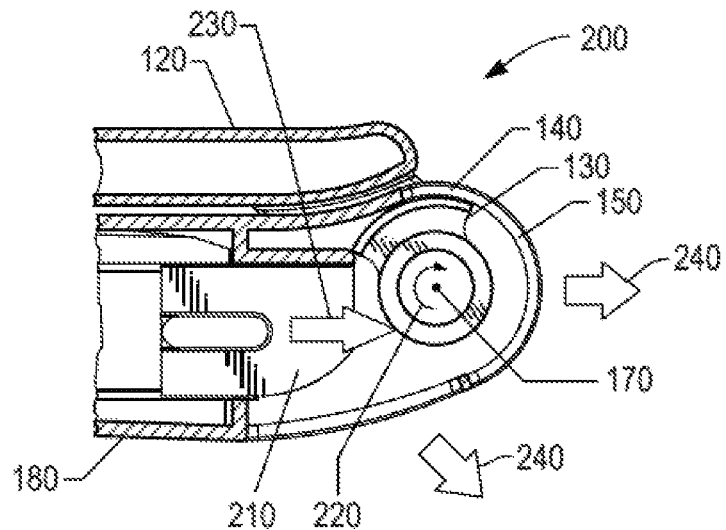
FIG. 2A is a partial sectional view depicting an illustrative flow diversion system, according to one or more embodiments described herein.
Figure 2B:
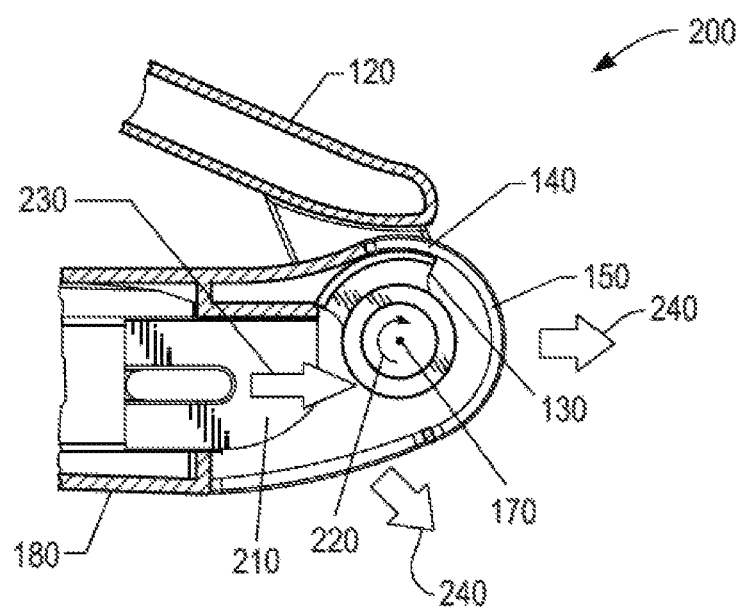
FIG. 2B is a partial sectional view depicting the illustrative flow diversion system depicted in FIG. 2A, according to one or more embodiments described herein.
Figure 2C:
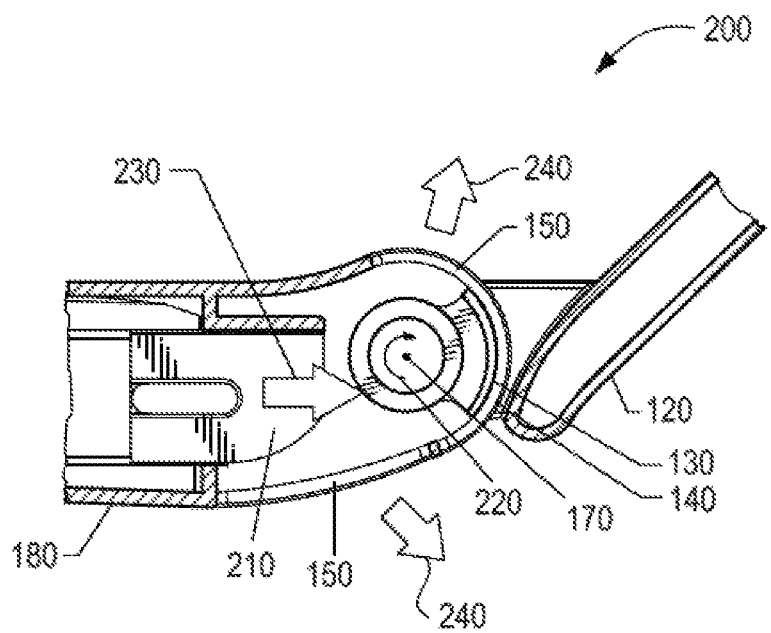
FIG. 2C is a partial sectional view depicting the illustrative flow diversion system depicted in FIG. 2A, according to one or more embodiments described herein.
Figure 2D:
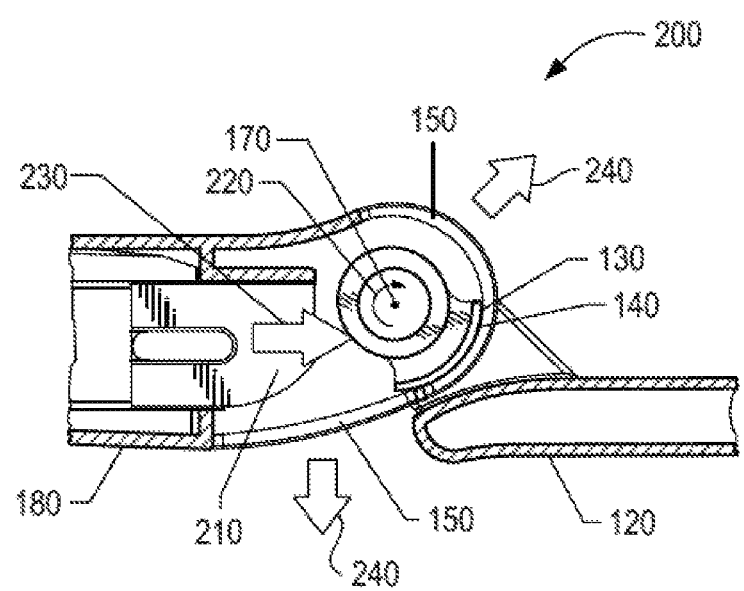
FIG. 2D is a partial sectional view depicting the illustrative flow diversion system depicted in FIG. 2A, according to one or more embodiments described herein.

For clarity and ease of description, FIGS. 2A, 2B, 2C, and 2D will be discussed in detail as a group. FIG. 2A is a partial sectional view depicting an illustrative flow diversion system 200, according to one or more embodiments. FIG. 2B is a partial sectional view depicting the illustrative flow diversion system 200 depicted in FIG. 2A, according to one or more embodiments. FIG. 2C is a partial sectional view depicting the illustrative flow diversion system 200 depicted in FIG. 2A, according to one or more embodiments. FIG. 2D is a partial sectional view depicting the illustrative flow diversion system 200 depicted in FIG. 2A, according to one or more embodiments.

The flow diversion system 200 can include a computing device 210 disposed at least partially within the enclosure 180. The enclosure 180 can be communicatively coupled and operably connected to the electronic device 120 via one or more hinges. The electronic device 120 can be rotatably displaceable through an arc 220 about a common axis 170. The computing device 210 can include at least one heat producing device and can include at least one fluid mover configured to draw a fluid across the at least one heat prod to provide a warm fluid 230. The warm fluid 230 can exit the enclosure 180 via the open CSA portion 150 of the vent 110 disposed proximate the hinge, thereby providing at least one exhaust 240.

As discussed in detail above with regards to FIGS. 1A-1B, the shutter 130 can apportion the vent 110 into a dosed CSA portion 140 and an open CSA portion 150. Referring to FIGS. 2A-2D, as the electronic device 120 is rotated about the common axis 170, the shutter 130 can rotate in conjunction with the electronic device, causing at least a portion of the exhaust 240 to flow in a direction that minimizes the impingement of the exhaust 240 on the electronic device 120.

Figure 3:
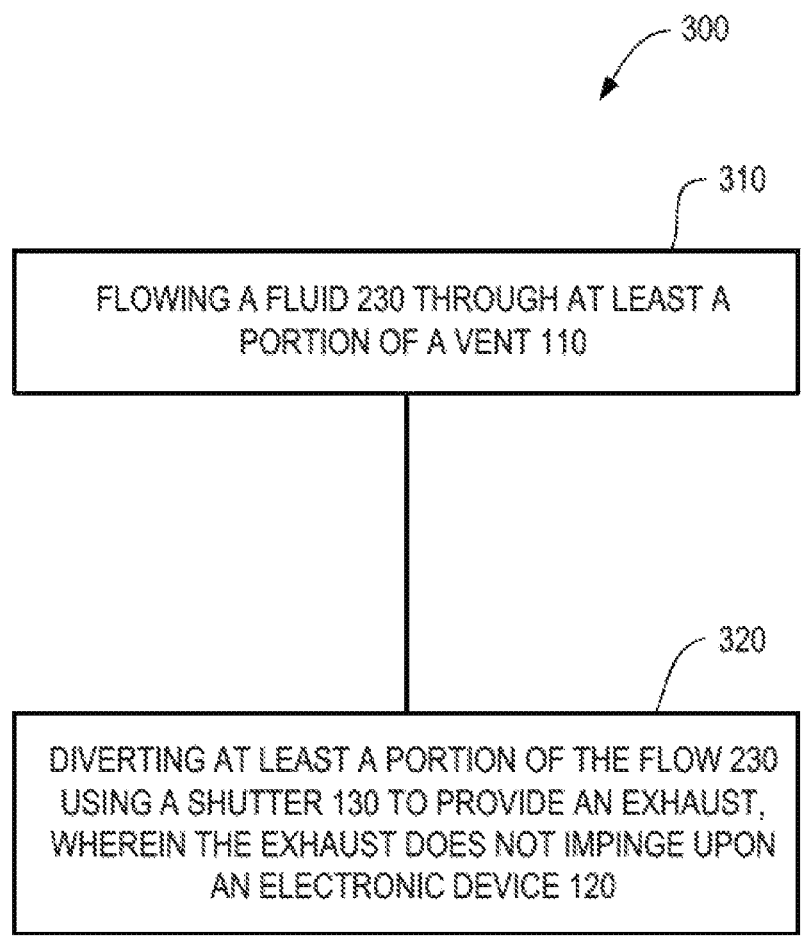
FIG. 3 is a flow diagram depicting an illustrative flow diversion method, according to one or more embodiments described herein.

FIG. 3 is a flow diagram depicting an illustrative flow diversion method 300, according to one or more embodiments. The flow diversion method 300 can include flowing 310 a fluid 230 through at least a portion of a vent 110, for example through an open CSA portion 150 of the vent 110. An electronic device 120, for example a display device, can be displaceable through a range of motion, for example an arc 220, and can be disposed proximate the vent 110.

The method can also include diverting 320 at least a portion of the fluid 230 using a shutter 130 to provide an exhaust 240. The shutter 130 can be operably connected to the electronic device 120 in such a manner that any displacement of the electronic device 120 causes a similar displacement of the shutter 130. Thus, regardless of the position of the electronic device 120 and shutter 130, the exhaust 240 can be diverted such that at least a portion of the exhaust does not impinge upon the electronic device 120.

Certain embodiments and features have been described using a set of numerical upper limits and a set of numerical lower limits. It should be appreciated that ranges from any lower limit to any upper limit are contemplated uneasy otherwise indicated. Certain lower limits, upper limits and ranges appear in one or more claims below. All numerical values are "about" or "approximately" the indicated value, and take into account experimental error and variations that would be expected by a person having ordinary skill in the art.

While the foregoing is directed to embodiments of the present invention, other and further embodiments of the invention may tie devised without departing from the basic scope thereof, and the scope thereof is determined by the claims that follow.

We claim the following:

1. A flow diversion apparatus, comprising:
    a vent permitting the flow of a fluid therethrough;
    an electronic device, capable of a range of motion across at least a portion of the vent, disposed proximate at least a portion of the vent; and
    a shutter disposed proximate at least a portion of the vent opposite the electronic device;
       wherein the shutter, in conjunction with the electronic device, is capable of a range of motion across at least a portion of the vent; and
       wherein the shutter prevents at least a portion of the fluid flowing through the vent from impinging upon the electronic device.

2. The apparatus of claim 1,
    wherein the vent comprises a cross sectional area ("CSA");
    wherein the shutter apportions the CSA into a closed GSA portion and an open CSA portion; and
    wherein the open CSA portion is not reduced through the full range of motion of the shutter.

3. The apparatus of claim 1, further comprising a mechanical linkage operably connecting the shutter with the electronic device such that a displacement of the electronic device causes a proportionate displacement of the shutter.

4. The apparatus of claim 1, wherein the electronic device comprises a display device.

5. The apparatus of claim 1, wherein the shutter and vent comprise semicircular sections disposed along a common axis; and
    wherein the range of motion comprises an arc defined about the common axis.

6. The apparatus of claim 3, wherein the mechanical linkage operably connecting the electronic device and the shutter comprises:
    a catch operably connected to the electronic device, the catch adapted to engage a complementary feature disposed on the shutter; and
    a tension member operably connected to the shutter, the tension member adapted to bias the shutter to a predetermined position.

7. A flow diversion method, comprising:
    flowing a fluid through least a portion of a vent;
       wherein an electronic device is disposed proximate the vent and
       wherein the electronic device is displaceable through a range of motion; and
    diverting at least a portion of the fluid to provide an exhaust;
       wherein the diverting at least a portion of the fluid comprises a shutter disposed proximate the vent and opposite the electronic device;
       wherein the shutter in conjunction with the electronic device is disposable through the range of motion; and
       wherein the shutter prevents at least a portion of the exhaust from impinging upon the electronic device.

8. The method of claim 7,
    wherein the vent comprises a cross sectional area (CSA);
    wherein the shutter apportions the CSA into a dosed CSA portion and an open CSA portion; and
    wherein the open CSA portion is not reduced through the full range of motion of the shutter.

9. The method of claim 7, wherein the electronic device comprises a display device.

10. The method of claim 7, wherein the shutter and the vent comprise semicircular cross-sections aligned along a common central axis; and
    wherein the range of motion of the shutter and the electronic device comprises an angular range of motion about the common central axis.

11. A flow diversion system, comprising:
    a housing comprising a semicircular vent, the vent comprising a cross-sectional area (CSA) permitting the flow of a fluid therethrough;
    an electronic device disposed proximate the vent, the electronic device hingedly connected to the housing; the hinge and the vent sharing a common central axis;
       wherein the electronic device is capable of a range of motion about the common central axis, across at least a portion of the vent;
    a shutter having a semicircular section disposed proximate the vent, opposite the electronic device;
       wherein the shutter is capable of a range of motion about the common central axis, obstructing at least a portion of the vent;
       wherein the shutter configured to apportion the CSA into a closed CSA portion and an open CSA portion;

wherein the open CSA portion is not reduced through the full range of motion of the shutter; and wherein the shutter prevents at least a portion of the fluid flowing through the vent from impinging upon the electronic device.

12. The system of claim 11, further comprising a computing device disposed at least partially within the housing.

13. The system of claim 12, wherein the electronic device comprises a display device communicatively coupled to the computing device.

14. The system of claim 12, wherein the computing device comprises a fluid mover adapted to discharge at least a portion of the fluid through the vent.

15. The s stem of claim 11, further comprising a mechanical linkage operably connecting the electronic device and the shutter.

16. The system of claim 15, wherein the mechanical linkage operably connecting the electronic device and the shutter comprises:

a catch operably connected to the etectronic device, the catch adapted to engage a complementary feature disposed on the shutter; and a tension member operably connected to the shutter, the tension member adapted to has the shutter to a predetermined position.

* * * * *

UNITED STATES PATENT AND TRADEMARK OFFICE
CERTIFICATE OF CORRECTION

| | | |
|---|---|---|
| PATENT NO. | : 8,937,806 B2 | Page 1 of 1 |
| APPLICATION NO. | : 13/697512 | |
| DATED | : January 20, 2015 | |
| INVENTOR(S) | : Mark David Senatori | |

It is certified that error appears in the above-identified patent and that said Letters Patent is hereby corrected as shown below:

In the Claims

In column 5, line 64, in Claim 2, delete "GSA" and insert -- CSA --, therefor.

In column 6, line 38, in Claim 8, delete "(CSA)" and insert -- ("CSA") --, therefor.

In column 6, line 53, in Claim 11, delete "(CSA)" and insert -- ("CSA") --, therefor.

In column 7, line 14, in Claim 15, delete "s stem" and insert -- system --, therefor.

In column 7, line 20, in Claim 16, delete "etectronic" and insert -- electronic --, therefor.

In column 7, line 24, in Claim 16, delete "has" and insert -- bias --, therefor.

Signed and Sealed this
Second Day of June, 2015

Michelle K. Lee
*Director of the United States Patent and Trademark Office*